(12) United States Patent
Xiao (10) Patent No.: US 12,013,616 B2
(45) Date of Patent: Jun. 18, 2024

(54) ARRAY SUBSTRATE AND DISPLAY PANEL

(71) Applicant: TCL CHINA STAR OPTOELECTRONICS TECHNOLOGY CO., LTD., Shenzhen (CN)

(72) Inventor: Bangqing Xiao, Shenzhen (CN)

( * ) Notice: Subject to any disclaimer, the term of this patent is extended or adjusted under 35 U.S.C. 154(b) by 463 days.

(21) Appl. No.: 17/279,120

(22) PCT Filed: Mar. 8, 2021

(86) PCT No.: PCT/CN2021/079487
§ 371 (c)(1),
(2) Date: Mar. 24, 2021

(87) PCT Pub. No.: WO2022/165907
PCT Pub. Date: Aug. 11, 2022

(65) Prior Publication Data
US 2023/0102513 A1   Mar. 30, 2023

(30) Foreign Application Priority Data

Feb. 7, 2021 (CN) .......................... 202110177068.7

(51) Int. Cl.
*G02F 1/1362* (2006.01)
*G02F 1/1343* (2006.01)
*G02F 1/1345* (2006.01)
*G09G 3/36* (2006.01)
*H01L 27/12* (2006.01)

(52) U.S. Cl.
CPC .. *G02F 1/136286* (2013.01); *G02F 1/134345* (2021.01); *G02F 1/13454* (2013.01); *G09G 3/3611* (2013.01); *H01L 27/124* (2013.01); *G09G 2300/0408* (2013.01)

(58) Field of Classification Search
CPC ......... G02F 1/138286; G02F 1/134345; G02F 1/13454; G09G 3/3611; G09G 2300/0408; H01L 27/124
USPC ........................................................... 349/33
See application file for complete search history.

(56) References Cited

U.S. PATENT DOCUMENTS

2013/0321376 A1   12/2013   Kim et al.

FOREIGN PATENT DOCUMENTS

| CN | 102403320 A | 4/2012 | |
|---|---|---|---|
| CN | 102466931 A | 5/2012 | |
| CN | 104849928 A | 8/2015 | |
| CN | 104881195 A | 9/2015 | |
| CN | 105353932 A | 2/2016 | |
| CN | 107179622 A | 9/2017 | |
| WO | WO-2018233296 A1 * | 12/2018 | ......... G02F 1/13338 |

* cited by examiner

*Primary Examiner* — Alexander P Gross
*Assistant Examiner* — William D Peterson (57) ABSTRACT

Embodiments of the present invention disclose an array substrate and a display panel. The array substrate includes a first substrate, and a first metal layer, a second metal layer, and a first shielding line sequentially disposed on the first substrate. The first metal layer includes a plurality of scan lines, the second metal layer includes a signal transmission line electrically connected to all of the scan lines, and at least a part of an orthographic projection of a wiring part of the signal transmission line on the first substrate coincides with an orthographic projection of the first shielding line on the first substrate.

13 Claims, 7 Drawing Sheets

ARRAY SUBSTRATE AND DISPLAY PANEL

FIELD OF INVENTION

The present invention relates to the field of display technology, in particular, to an array substrate and a display panel.

BACKGROUND OF INVENTION

In a display panel driven by gate driver on array (GOA), scan driving signals are input to scan lines from both sides of the display panel, so as to reduce an influence of a resistance voltage drop. Therefore, it is necessary to arrange a GOA module at both sides of the display panel, which leads to a GOA design that greatly increases a width of a frame of the display panel and reduces a visual experience.

In the display panel driven by gate driver on array (GOA), GOA design will greatly increase the width of the frame of the display panel and reduce the visual experience.

SUMMARY

A first aspect of the present invention provides an array substrate comprising:
   a first substrate;
   a first metal layer disposed on a side of the first substrate, wherein the first metal layer comprises a plurality of scan lines arranged along a first direction;
   a second metal layer disposed on a side of the first metal layer away from the first substrate, wherein the second metal layer comprises a signal transmission line, and the signal transmission line is electrically connected to all of the scan lines; and
   a pixel electrode layer disposed on a side of the second metal layer away from the first substrate;
   wherein the signal transmission line comprises a wiring part disposed corresponding to the pixel electrode layer, the wiring part is arranged along a second direction, a first shielding line is disposed between the wiring part and the pixel electrode layer, and at least a part of an orthographic projection of the wiring part on the first substrate coincides with an orthographic projection of the first shielding line on the first substrate.

Alternatively, in some embodiments of the present invention, the first shielding line extends in the second direction, and the orthographic projection of the wiring part on the first substrate is defined within a region where the orthographic projection of the first shielding line on the first substrate is located.

Alternatively, in some embodiments of the present invention, the first shielding line is provided with a hollow structure, and at least a part of an orthographic projection of the hollow structure on the first substrate coincides with the orthographic projection of the wiring part on the first substrate.

Alternatively, in some embodiments of the present invention, the hollow structure comprises a plurality of through holes spaced apart from each other.

Alternatively, in some embodiments of the present invention, the plurality of through holes are arranged along the second direction, and at least a part of an orthographic projection of each through hole on the first substrate coincides with the orthographic projection of the wiring part on the first substrate.

Alternatively, in some embodiments of the present invention, the second metal layer further comprises a plurality of data lines disposed in a same layer as the signal transmission line, the plurality of data lines extend in the second direction, and the plurality of data lines are spaced apart from the signal transmission line.

Alternatively, in some embodiments of the present invention, the array substrate further comprises a plurality of second shielding lines corresponding to the data lines in one-to-one correspondence, and the second shielding lines are disposed in a same layer as the first shielding line and separated from the first shielding line.

Alternatively, in some embodiments of the present invention, the pixel electrode layer comprises a plurality of sub-pixel electrodes spaced apart from each other, each of the sub-pixel electrodes comprises a main electrode and a branch electrode connected to the main electrode, and the main electrode comprises a first part extending in the second direction; and
   at least a part of the orthographic projection of the wiring part on the first substrate coincides with an orthographic projection of the first part on the first substrate.

A second aspect of the present invention provides a display panel comprising a color film substrate and an array substrate, the color film substrate and the array substrate are arranged oppositely, a liquid crystal layer is disposed between the color film substrate and the array substrate, and the array substrate comprises:
   a first substrate;
   a first metal layer disposed on a side of the first substrate, wherein the first metal layer comprises a plurality of scan lines arranged along a first direction;
   a second metal layer disposed on a side of the first metal layer away from the first substrate, wherein the second metal layer comprises a signal transmission line, and the signal transmission line is electrically connected to all of the scan lines; and
   a pixel electrode layer disposed on a side of the second metal layer away from the first substrate;
   wherein the signal transmission line comprises a wiring part disposed corresponding to the pixel electrode layer, the wiring part is arranged along a second direction, a first shielding line is disposed between the wiring part and the pixel electrode layer, and at least a part of an orthographic projection of the wiring part on the first substrate coincides with an orthographic projection of the first shielding line on the first substrate.

Alternatively, in some embodiments of the present invention, the first shielding line extends in the second direction, and the orthographic projection of the wiring part on the first substrate is defined within a region where the orthographic projection of the first shielding line on the first substrate is located.

Alternatively, in some embodiments of the present invention, the first shielding line is provided with a hollow structure, and at least a part of an orthographic projection of the hollow structure on the first substrate coincides with the orthographic projection of the wiring part on the first substrate.

Alternatively, in some embodiments of the present invention, the hollow structure comprises a plurality of through holes spaced apart from each other.

Alternatively, in some embodiments of the present invention, the plurality of through holes are arranged along the second direction, and at least a part of an orthographic projection of each through hole on the first substrate coincides with the orthographic projection of the wiring part on the first substrate.

Alternatively, in some embodiments of the present invention, the second metal layer further comprises a plurality of data lines disposed in a same layer as the signal transmission line, the plurality of data lines extend in the second direction, and the plurality of data lines are spaced apart from the signal transmission line.

Alternatively, in some embodiments of the present invention, the display panel further comprises a plurality of second shielding lines corresponding to the data lines in one-to-one correspondence, and the second shielding lines are disposed in a same layer as the first shielding line and separated from the first shielding line.

Alternatively, in some embodiments of the present invention, the display panel further comprising a driving module disposed on a side of the array substrate along a longitudinal direction of the data line, the driving module is connected to the data lines and the signal transmission line of the array substrate, and the driving module is configured to provide the data lines with data driving signals and configured to provide the signal transmission line with scan driving signals.

Alternatively, in some embodiments of the present invention, the pixel electrode layer comprises a plurality of sub-pixel electrodes spaced apart from each other, each of the sub-pixel electrodes comprises a main electrode and a branch electrode connected to the main electrode, and the main electrode comprises a first part extending in the second direction; and at least a part of the orthographic projection of the wiring part on the first substrate coincides with an orthographic projection of the first part on the first substrate.

By means of inputting the scan driving signals from one side through the signal transmission line, and transmitting the scan driving signals to the scan lines, the scan driving signals can be input from one side of the display panel instead of being input from both sides of the display panel. At this time, the GOA module can be merely arranged on one side of the display panel, and when the GOA module and the data driving module are arranged on a same side of the display panel, the scan driving signal and the data driving signal can be input on one side of the display panel at the same time. Therefore, the width of the frame on both sides of the display panel can be greatly reduced, and the visual experience of the display panel can be improved.

DESCRIPTION OF DRAWINGS

The technical solutions, as well as other beneficial advantages, of the present invention will be apparent from the following detailed descriptions of embodiments of the present invention, with reference to the attached drawings.

PARTS LIST 10, array substrate; 11, first substrate; 121, scan line; 122, common electrode; 131, data line; 132, signal transmission line; 132a, wiring part; 132b, connecting part; 133, source and drain electrode layer; 133a, source electrode; 133b, drain electrode; 14, sub-pixel unit; 151, first shielding line; 151a, through hole; 152, second shielding line; 16, pixel electrode layer; 161, sub-pixel electrode; 161a, first part; 161b, second part; 161c, branch electrode; 171, first insulating layer; 172, second insulating layer; 173, passivation layer; 174, color resist layer; 175, planarization layer; 20, color film substrate; 21, second substrate; 22, common electrode; 30, liquid crystal layer; 40, driving module.

DETAILED DESCRIPTION OF EMBODIMENTS

The following description of every embodiment with reference to the accompanying drawings is used to exemplify a specific embodiment which may be carried out in the present invention The directional terms mentioned in the present invention, such as "top", "bottom", "front", "back", "left", "right", "inside", "outside", "side", are only used with reference to orientations of the accompanying drawings. Therefore, the used directional terms are intended to illustrate, but not to limit, the present invention. In the drawings, units with similar structures are indicated by a same reference numeral.

The embodiments of the present invention provide an array substrate and a display panel. The detailed description will be given below. It should be noted that the description order of the following embodiments is not intended to limit the preferred order of the embodiments.

Figure 1:
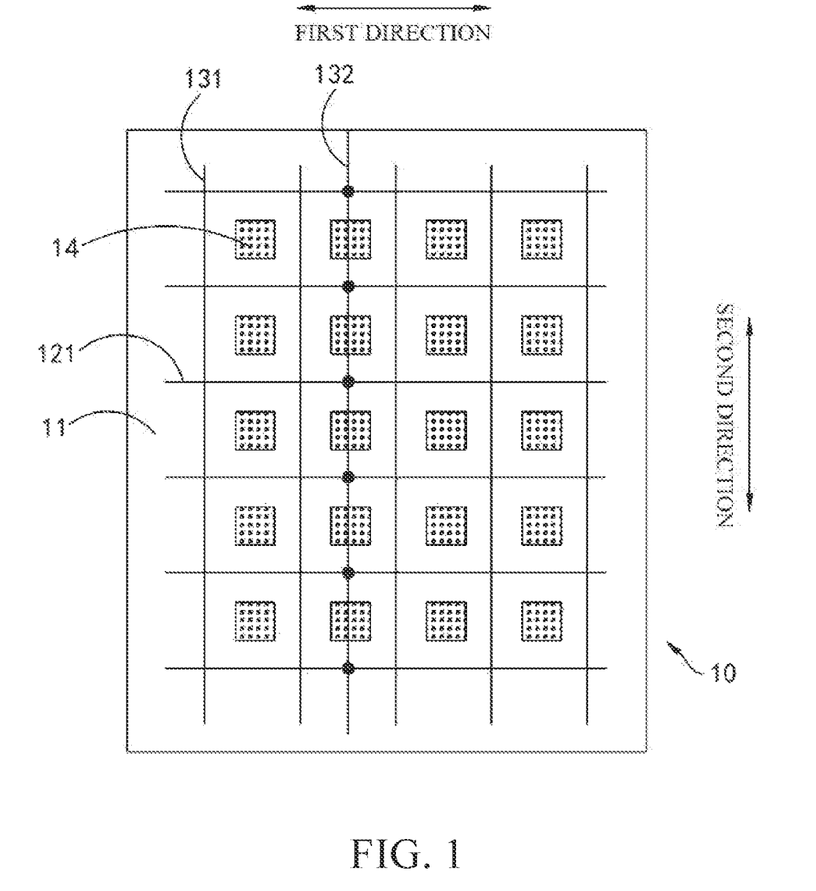
FIG. 1 is a schematic view of an arrangement of sub-pixel units in an embodiment of the present invention.
Figure 2:
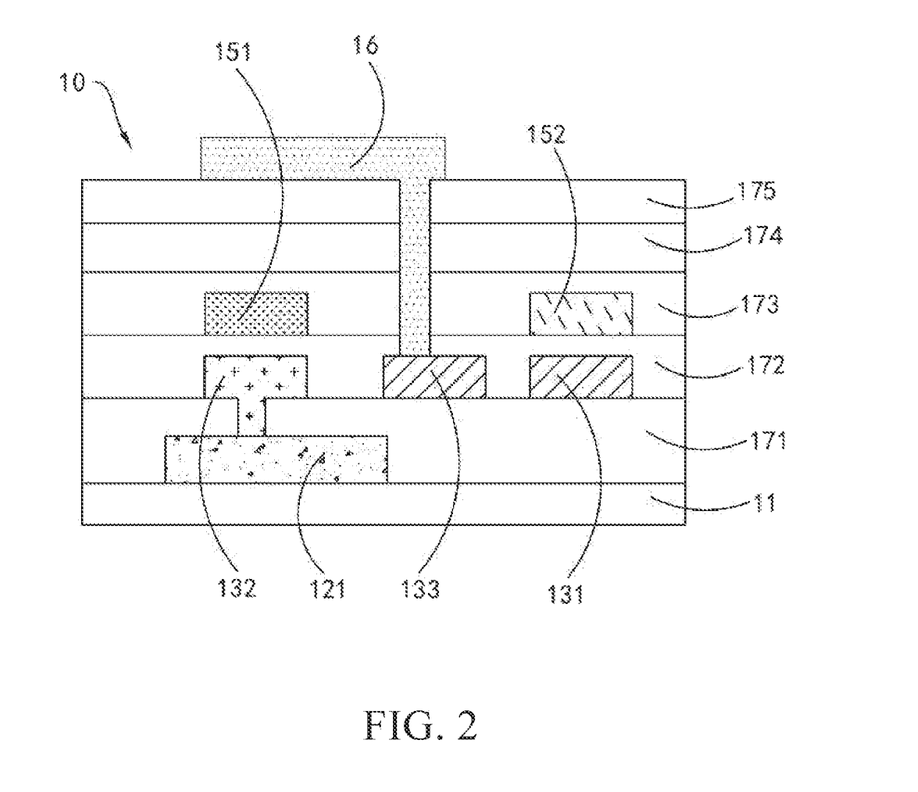
FIG. 2 is a schematic view of a structure of an array substrate in an embodiment of the present invention.

The present invention provides an array substrate. As shown in FIG. 1, the array substrate 10 comprises a first substrate 11, a plurality of sub-pixel units 14 disposed in array on the first substrate 11, and a plurality of scan lines 121 and a plurality of data lines 131 disposed on the first substrate 11.

The scan lines 121 extend in a first direction, a plurality of scan lines 121 are arranged in a second direction, and each one of the plurality of scan lines 121 is connected to a row of the sub-pixel units 14 to provide the sub-pixel units 14 with scan driving signals Vgate.

The data lines 131 extend in the second direction, a plurality of data lines 131 are arranged in the first direction, and each one of the plurality of data lines 131 is connected to a column of the sub-pixel units 14 to provide the sub-pixel units 14 with data driving signals.

It should be noted that the second direction may be perpendicular to the first direction. For example, in FIG. 1, the first direction is a horizontal direction, i.e., the longitudinal direction of the scan lines 121; and the second direction is a longitudinal direction, i.e., the longitudinal direction of the data lines 131. A region defined by an intersection of two adjacent scan lines 121 and two adjacent data lines 131 is a region where the sub-pixel unit 14 is located.

In one embodiment, the array substrate 10 further comprises a signal transmission line 132 disposed on a different layer from the scan lines 121. The signal transmission line 132 extends in the second direction, and the signal transmission line 132 is electrically connected to all of the scan lines 121.

It should be noted that the signal transmission line 132 is configured to transmit the scan driving signals Vgate to the scan lines 121, so that the scan driving signals Vgate can be input from one side of the display panel instead of being input from both sides of the display panel. At this time, the GOA module can be merely arranged on one side of the display panel, and when the GOA module and the data driving module 40 are arranged on a same side of the display panel, the scan driving signal Vgate and the data driving signal can be input on one side of the display panel at the same time. Therefore, the width of the frame on both sides of the display panel can be greatly reduced, and the visual experience of the display panel can be improved.

As shown in FIGS. 2-6, in one embodiment, the array substrate 10 comprises a first metal layer disposed on a side of the first substrate 11, a first insulating layer 171 covering the first metal layer, a second metal layer disposed on a side of the first metal layer away from the first substrate 11, and a pixel electrode layer 16 disposed on a side of the second metal layer away from the first substrate 11.

The first metal layer comprises the scan lines 121, the second metal layer comprises the data lines 131 and the signal transmission line 132, the signal transmission line 132 comprises a wiring part 132a disposed corresponding to the pixel electrode layer 16, and the wiring part 132a is arranged along the second direction.

A first shielding line 151 is disposed between the wiring part 132a and the pixel electrode layer 16, and at least a part of an orthographic projection of the wiring part 132a on the first substrate 11 coincides with an orthographic projection of the first shielding line 151 on the first substrate 11.

Figure 3:
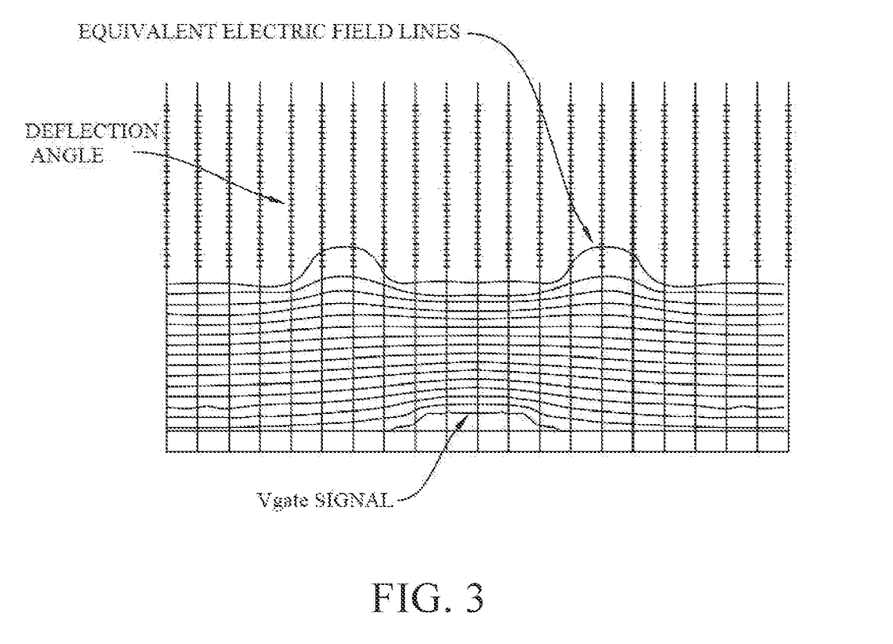
FIG. 3 is a schematic view of an electric field simulation of a display panel when a signal transmission line is not provided in the present invention.

It should be noted that, as shown in FIG. 3, FIG. 3 is a schematic view of an electric field simulation of a display panel when a signal transmission line 132 is not provided. During a display driving process of the display panel, a voltage of the scan driving signal Vgate will change, for example a voltage of the scan driving signal Vgate changes from a driving voltage of a positive line to a turn-off voltage of a negative line, a change in the electric field of the wiring part 132a easily interferes with an electric field of the pixel electrode, such that a liquid crystal deflection direction above the signal transmission line 132 is different from a normal liquid crystal deflection direction, which affects the display effect.

Figure 4:
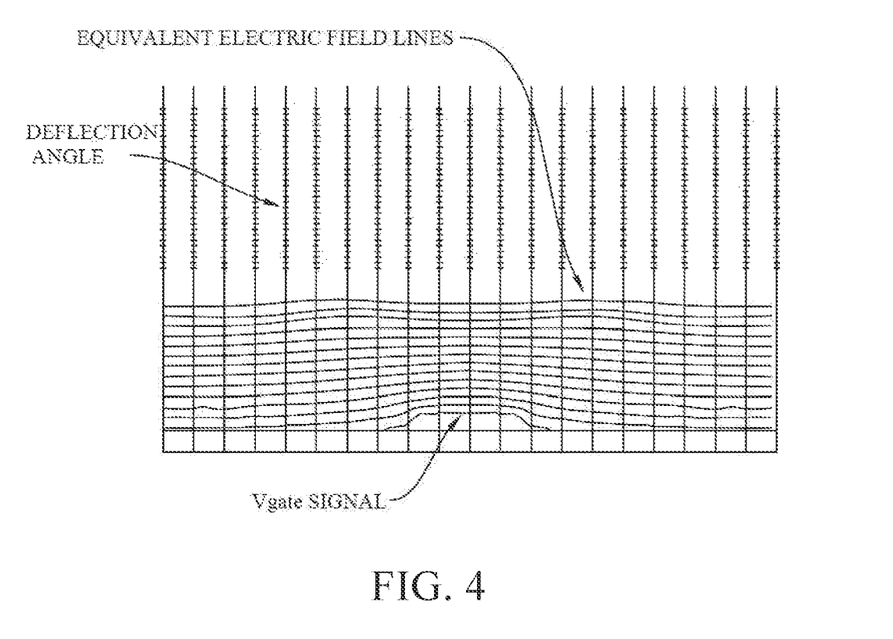
FIG. 4 is a schematic view of an electric field simulation of the display panel when a signal transmission line is provided in the present invention.

As shown in FIG. 4, FIG. 4 is a schematic view of an electric field simulation of the display panel when a signal transmission line 132 is provided in the present invention. In the present invention, the first shielding line 151 is added between the wiring part 132a and the pixel electrode. Using an electric field generated by shielding the wiring part 132a by the first shielding line 151, the electric field formed by the scan driving signal Vgate in the wiring part 132a is constrained under the first shielding line 151, thereby reducing an influence of the signal transmission line 132 on the pixel electrode, and improving the display effect and display stability of the display panel.

It should also be noted that the orthographic projection of the wiring part 132a on the first substrate 11 and the orthographic projection of the first shielding line 151 on the first substrate 11 may partially or completely coincide with each other.

When the orthographic projection of the wiring part 132a on the first substrate 11 and the orthographic projection of the first shielding line 151 on the first substrate 11 completely coincide with each other, a width of the first shielding line 151 is greater than or equal to that of the wiring part 132a, and the length of the first shielding line 151 is greater than or equal to that of the wiring part 132a. At this time, the orthographic projection of the first shielding line 151 on the first substrate 11 completely covers the orthographic projection of the wiring part 132a on the first substrate 11.

When the orthographic projection of the wiring part 132a on the first substrate 11 and the orthographic projection of the first shielding line 151 on the first substrate 11 partially coincide with each other, the width of the first shielding line 151 may be greater than, equal to, or less than that of the wiring part 132a, and the length of the first shielding line 151 may be greater than, equal to, or less than that of the wiring part 132a.

In one embodiment, the first shielding line 151 extends in the second direction, and the orthographic projection of the wiring part 132a on the first substrate 11 is defined within a region where the orthographic projection of the first shielding line 151 on the first substrate 11 is located.

It can be understood that the region where the orthographic projection of the first shielding line 151 on the first substrate 11 is located refers to a region defined by a side contour of the orthographic projection of the first shielding line 151 on the first substrate 11. At this time, the length of the first shielding line 151 is greater than or equal to that of the wiring part 132a, and the width of the first shielding line 151 is greater than or equal to that of the wiring part 132a.

In one embodiment, the entirety of the first shielding line 151 is a solid structure, and the orthographic projection of the first shielding line 151 on the first substrate 11 covers the orthographic projection of the wiring part 132a on the first substrate 11 to achieve a better signal shielding effect.

In another embodiment, the first shielding line 151 is provided with a hollow structure, and at least a part of an orthographic projection of the hollow structure on the first substrate 11 coincides with the orthographic projection of the wiring part 132a on the first substrate 11.

It should be noted that when the wiring part 132a completely overlaps the first shielding line 151, a capacitance formed between the signal transmission line 132 and the first shielding line 151 will increase, which will affect the display effect. By providing a hollow structure overlapping the wiring part 132a on the first shielding line 151, an overlap area of the signal transmission line 132 and the first shielding line 151 can be reduced while ensuring that the first shielding line 151 has a good signal shielding effect, thereby reducing the capacitance formed between the signal transmission line 132 and the first shielding line 151.

Specifically, the hollow structure comprises a plurality of through holes 151a spaced apart from each other, and the plurality of through holes 151a may be evenly arranged or scatteredly arranged.

In an embodiment, the plurality of through holes 151a are arranged along the second direction, and at least a part of an orthographic projection of each through hole 151a on the first substrate 11 coincides with the orthographic projection of the wiring part 132a on the first substrate 11.

It can be understood that, by a design of a position and arrangement of the through holes 151a, the first shielding line 151 covers the wiring part 132a in an intermittent manner, so as to reduce the overlap area of the signal transmission line 132 and the first shielding line 151 as much as possible while ensuring that the first shielding line 151 still has good signal shielding. A size of the through holes 151a and a distance between two adjacent through holes 151a can be selected according to actual conditions.

Figure 5:
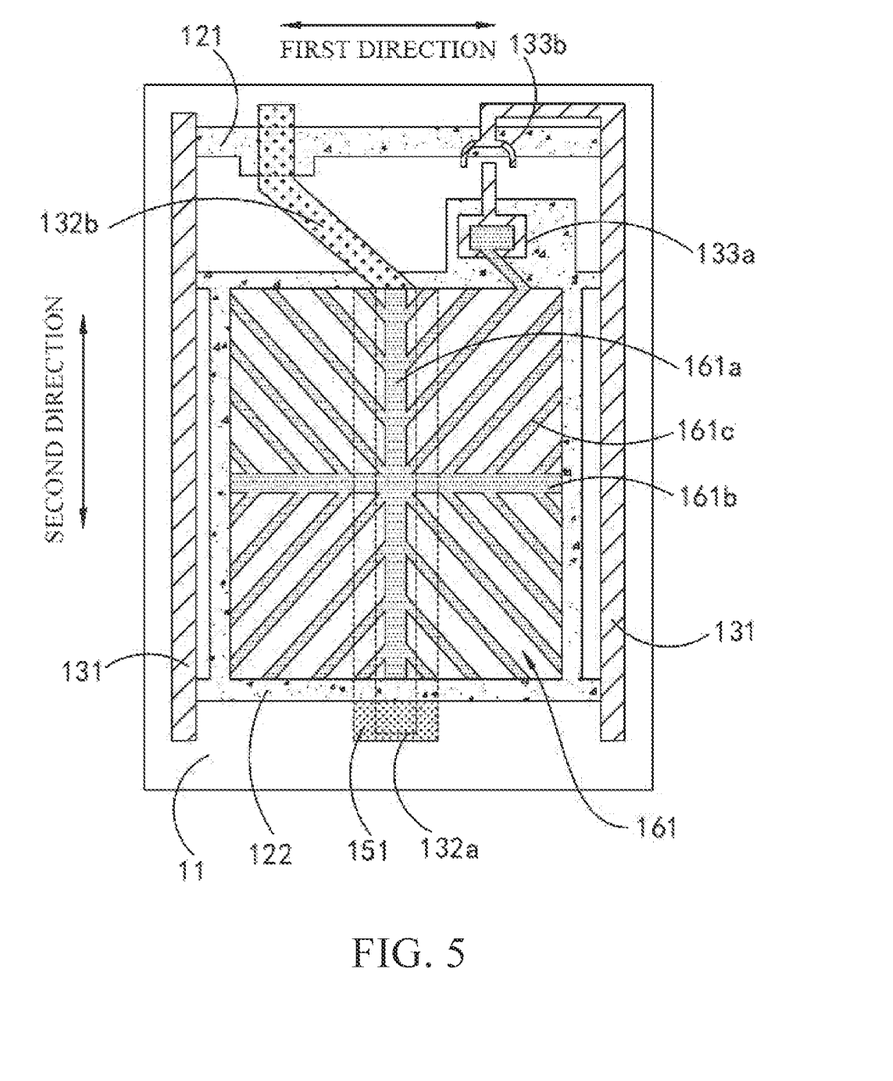
FIG. 5 is a schematic view of a structure of the sub-pixel units in an embodiment of the present invention.
Figure 6:
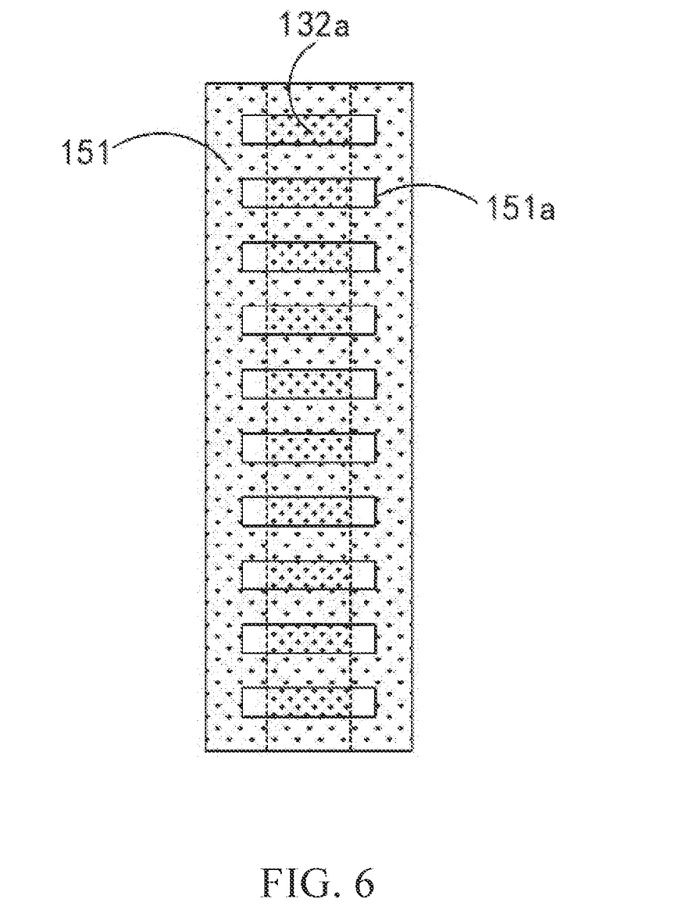
FIG. 6 is a schematic view of a structure of a wiring part and a first shielding line in an embodiment of the present invention.

It should be noted that FIG. 5 merely illustrates a case in which the through holes 151a are rectangular. In other embodiments, the through holes 151a may also have a regular shape or an irregular shape, such as a triangle, a circle, a semicircle, an ellipse, a square, a pentagon or an irregular quadrilateral.

In one embodiment, the data lines 131 and the signal transmission line 132 are disposed in a same layer, and the data lines 131 and the signal transmission line 132 are spaced apart to reduce an overall thickness of the array substrate 10.

The data lines 131 and the signal transmission line 132 can be formed by using a same material and using a same etching process to reduce a manufacturing cost of the array substrate 10.

Specifically, the array substrate further comprises a plurality of second shielding lines 152 corresponding to the data lines 131 in one-to-one correspondence, and the second shielding lines 152 are disposed in a same layer as the first shielding line 151 and separated from the first shielding line 151.

It should be noted that the second shielding lines 152 are configured to shield signals of the data lines 131 to prevent a signal change on the data lines 131 from affecting a normal operation of the pixel electrode. In a traditional design, the second shielding lines 152 are disposed in a same layer as the pixel electrode layer 16, in order to prevent the same layer of metal from short-circuiting, and a distance between the second shielding lines 152 and the pixel electrode layer 16 needs to be greater than a set value, thereby affecting an aperture ratio.

However, in the present invention, the second shielding lines 152 and the first shielding line 151 are disposed in the same layer, and the distance between the second shielding lines 152 and the pixel electrode layer 16 may not be considered, so that the aperture ratio can be improved.

The second shielding lines 152 can be formed of a non-transparent material, which can replace a role of a black matrix to remove the black matrix that needs to be disposed above the data lines 131 and reduce a production cost. The first shielding line 151 and the second shielding lines 152 can be formed by using a same material and using a same etching process to reduce a manufacturing cost of the array substrate 10.

Specifically, the pixel electrode layer 16 comprises a plurality of sub-pixel electrodes 161 spaced apart from each other, each of the sub-pixel electrodes 161 comprises a main electrode and a branch electrode 161c connected to the main electrode, and the main electrode comprises a first part 161a extending in the second direction.

At least a part of the orthographic projection of the wiring part 132a on the first substrate 11 coincides with an orthographic projection of the first part 161a on the first substrate 11.

It should be noted that one sub-pixel unit 14 comprises one sub-pixel electrode 161, and each of sub-pixel electrodes 161 provides a corresponding sub-pixel unit 14 with a display driving voltage.

It should also be noted that a region where the main electrode is provided on the array substrate 10 is a dark region where the liquid crystals are inverted and disordered, which does not contribute to an aperture ratio. The wiring part 132a of the signal transmission line 132 is overlapped with the main electrode, and at this time, the first shielding line 151 will also overlap the main electrode correspondingly, so that an influence of the signal transmission line 132 and the first shielding line 151 on the aperture ratio can be reduced.

Specifically, the wiring part 132a comprises split bodies corresponding to the sub-pixel electrodes 161 in one-to-one correspondence, and the signal transmission line 132 further comprises a connecting part 132b to connect two adjacent split bodies. At least a part of an orthographic projection of the split body on the first substrate 11 coincides with an orthographic projection of the first part 161a on the first substrate 11, and the connecting part 132b is connected to the scan lines 121 through a via hole.

It should be noted that the signal transmission line 132 crosses a column of sub-pixel units 14 to connect to all of the scan lines 121, and the signal transmission line 132 is configured to cross the split body of the sub-pixel electrode 161 and correspondingly arranged under the sub-pixel electrode 161. Therefore, an influence of the signal transmission line 132 and the first shielding line 151 on the aperture ratio is further reduced.

In one embodiment, the main electrode further comprises a second part 161b arranged along the second direction, and the second part 161b intersects the first part 161a to form a cross-shaped structure.

The main electrode defines a region where the sub-pixel electrode 161 is located into 4 domain regions, each domain region is provided with a plurality of branch electrodes 161c spaced apart, and the branch electrodes 161c are arranged obliquely.

In one embodiment, each of the sub-pixel units 14 further comprises a common electrode 122 provided in a same layer as the scan lines 121, and the common electrode 122 and the scan lines 121 can be made of a same material and formed in a same process.

At least a part of an orthographic projection of the common electrode 122 on the first substrate 11 coincides with the orthographic projection of the sub-pixel electrode 161 on the first substrate 11, and an overlapped part of the common electrode 122 and the sub-pixel electrode 161 forms a storage capacitor.

In one embodiment, each of the sub-pixel units 14 further comprises a source and drain electrode layer 133 provided in a same layer as the data lines 131 and the signal transmission line 132.

The source and drain electrode layer 133 comprises a source electrode 133a and a drain electrode 133b, the sub-pixel electrode 161 is connected to one of the source electrode 133a or the drain electrode 133b through a via hole, and the data lines 131 are connected to the other one of the source electrode 133a or the drain electrode 133b.

In one embodiment, the array substrate 10 further comprises a first insulating layer 171, a second insulating layer 172, a passivation layer 173, a color resist layer 174, and a planarization layer 175 disposed in sequence.

The first insulating layer 171 is disposed on the first substrate 11 and covers the first metal layer and the common electrode 122.

The second metal layer and the source and drain electrode layer 133 are disposed on a side of the first insulating layer 171 away from the first substrate 11, and the second insulating layer 172 covers the second metal layer and the source and drain electrode layer 133.

The first shielding line 151 and the second shielding lines 152 are disposed on a side of the second insulating layer 172 away from the first substrate 11, and the passivation layer 173 covers the first shielding line 151 and the second shielding lines 152.

The color resist layer 174 is disposed on a side of the passivation layer 173 away from the first substrate 11, the planarization layer 175 is disposed on a side of the color resist layer 174 away from the first substrate 11, and the pixel electrode layer 16 is disposed on a side of the planarization layer 175 away from the first substrate 11.

Figure 7:
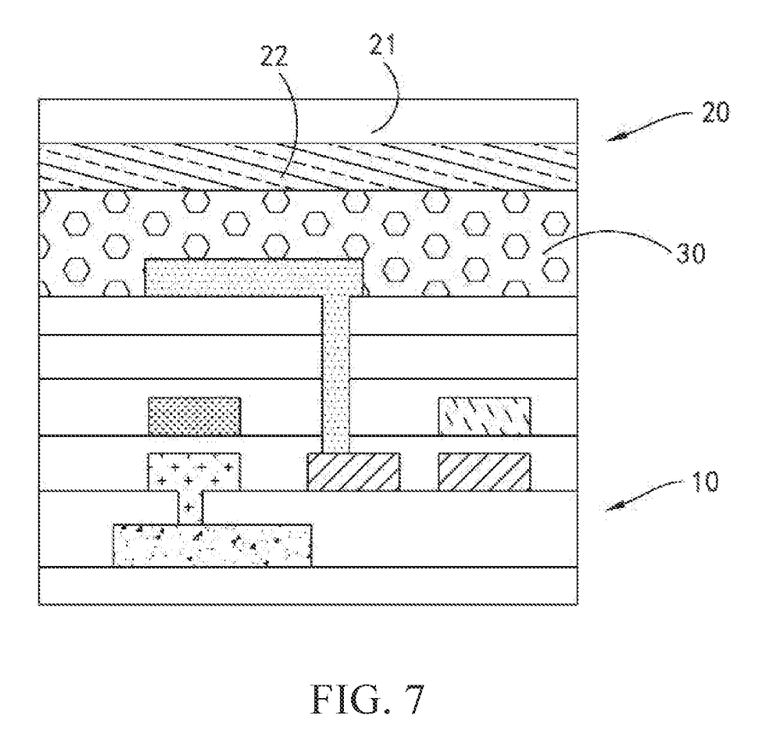
FIG. 7 is a schematic view of a structure of the display panel in an embodiment of the present invention.

Based on the above-mentioned array substrate 10, the present invention also provides a display panel. As shown in FIG. 7, the display panel comprises a color film substrate 20 and the array substrate 10 as described in any of the above embodiments. The color film substrate 20 and the array substrate 10 are arranged oppositely, and a liquid crystal layer 30 is disposed between the color film substrate 20 and the array substrate 10.

Specifically, the color film substrate 20 comprises a second substrate 21, and a common electrode 22 disposed on a side of the second substrate 21 close to the array substrate 10, and uses an electric field between the pixel electrode layer 16 and the common electrode 22 to drive the liquid crystals in the liquid crystal layer 30 to rotate.

Figure 8:
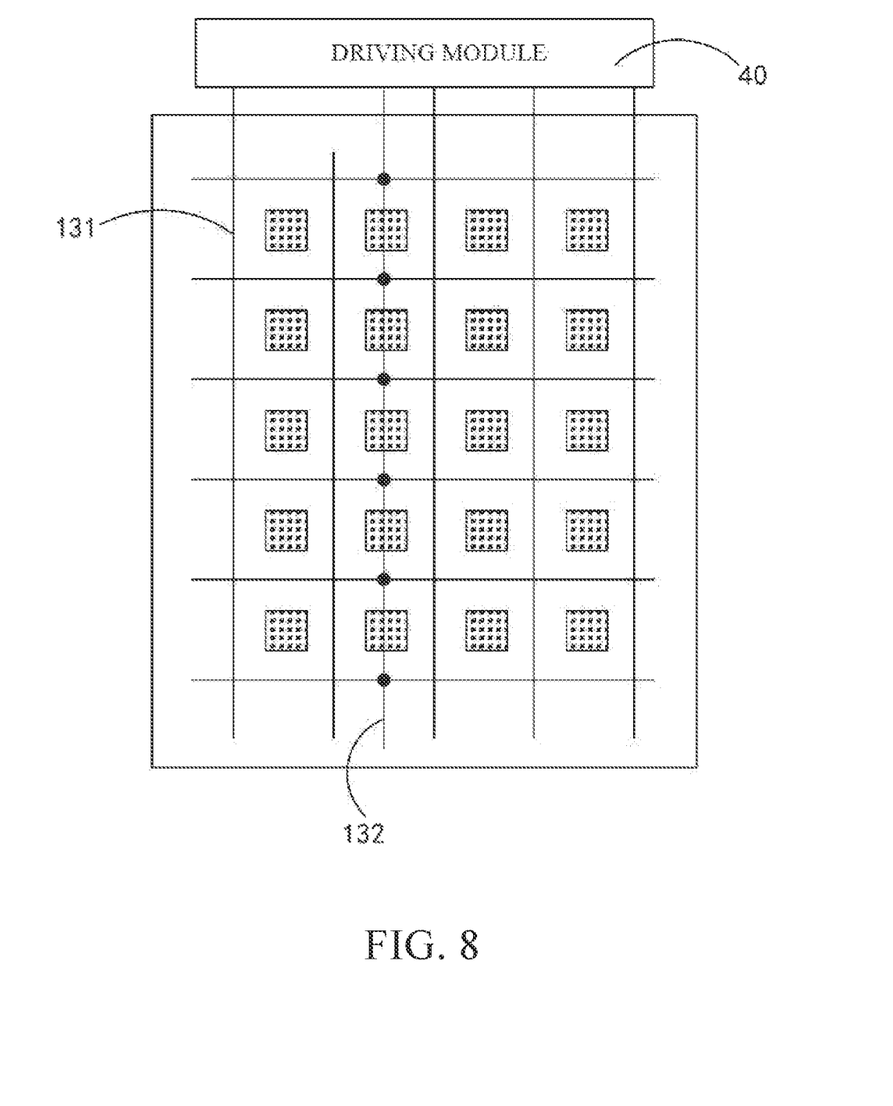
FIG. 8 is a schematic view of a structure of the display panel in an embodiment of the present invention.

In one embodiment, as shown in FIG. 8, the display panel further comprises a driving module 40, which is disposed on a side of the array substrate 10 along a longitudinal direction of the data lines 131. The driving module 40 is connected to the data lines 131 and the signal transmission line 132 of the array substrate 10, and the driving module 40 is configured to provide the data lines 131 with data driving signals and configured to provide the signal transmission line 132 with scan driving signals Vgate.

It should be noted that the driving module 40 comprises a GOA module and a data driving module 40, so that the scan driving signal Vgate and the data driving signal can be input on one side of the display panel at the same time. Therefore, the width of the frame on both sides of the display panel can be greatly reduced, and the visual experience of the display panel can be improved.

In the foregoing embodiments, the descriptions of the embodiments have their respective focuses. For a part that is not described in detail in an embodiment, reference may be made to related descriptions in other embodiments.

Specific examples are used herein to illustrate the principle and implementation of the present invention. The description of the above embodiments is only used to help understanding the technical solutions of the present invention and its core concept. Those skilled in the art should understand that they may still make modifications to the technical solutions described in the foregoing embodiments or make equivalent replacements to some or all technical features thereof, without departing from the scope of the technical solutions of the embodiments of the present invention.

What is claimed is:

1. An array substrate, comprising:
a first substrate;
a first metal layer disposed on a side of the first substrate, wherein the first metal layer comprises a plurality of scan lines, each of the scan lines extends along a first direction, and the plurality of scan lines are arranged along a second direction perpendicular to the first direction;
a second metal layer disposed on a side of the first metal layer away from the first substrate, wherein the second metal layer comprises a signal transmission line, and the signal transmission line is electrically connected to all of the scan lines; and
a pixel electrode layer disposed on a side of the second metal layer away from the first substrate;
wherein the signal transmission line comprises a wiring part disposed opposite to the pixel electrode layer, the wiring part extends along the second direction, a first shielding line is disposed over the wiring part and opposite to and below the pixel electrode layer,
the first shielding line extends in the second direction and is provided with a hollow structure, the hollow structure comprises a plurality of through holes which are spaced apart from each other and arranged along the second direction, a width of each of the through holes in the first direction is greater than a width of the wiring part, and at least a part of an orthographic projection of each of the through holes on the first substrate overlaps with an orthographic projection of the wiring part on the first substrate.

2. The array substrate as claimed in claim 1, wherein the second metal layer further comprises a plurality of data lines disposed in a same layer as the signal transmission line, each of the plurality of data lines extends in the second direction, and each of the plurality of data lines is spaced apart from the signal transmission line.

3. The array substrate as claimed in claim 2, wherein the array substrate further comprises a plurality of second shielding lines opposite to the data lines in one-to-one correspondence, and the second shielding lines are disposed in a same layer as the first shielding line and separated from the first shielding line.

4. The array substrate as claimed in claim 1, wherein the pixel electrode layer comprises a plurality of sub-pixel electrodes spaced apart from each other, each of the sub-pixel electrodes comprises a main electrode and a branch electrode connected to the main electrode, and the main electrode comprises a first part extending in the second direction; and
wherein at least a part of the orthographic projection of the wiring part on the first substrate overlaps with an orthographic projection of the first part on the first substrate.

5. A display panel, comprising a color film substrate and an array substrate, wherein the color film substrate and the array substrate are arranged oppositely, a liquid crystal layer is disposed between the color film substrate and the array substrate, and the array substrate comprises:
a first substrate;
a first metal layer disposed on a side of the first substrate, wherein the first metal layer comprises a plurality of scan lines, each of the scan lines extends along a first direction, and the plurality of scan lines are arranged along a second direction perpendicular to the first direction;
a second metal layer disposed on a side of the first metal layer away from the first substrate, wherein the second metal layer comprises a signal transmission line, and the signal transmission line is electrically connected to all of the scan lines; and
a pixel electrode layer disposed on a side of the second metal layer away from the first substrate;
wherein the signal transmission line comprises a wiring part disposed opposite to the pixel electrode layer, the wiring part extends along the second direction, a first shielding line is disposed over the wiring part and opposite to and below the pixel electrode layer,
the first shielding line extends in the second direction and is provided with a hollow structure, the hollow structure comprises a plurality of through holes which are spaced apart from each other and arranged along the second direction, a width of each of the through holes in the first direction is greater than a width of the wiring part, and at least a part of an orthographic projection of each of the through holes on the first substrate overlap with an orthographic projection of the wiring part on the first substrate.

6. The display panel as claimed in claim 5, wherein the second metal layer further comprises a plurality of data lines disposed in a same layer as the signal transmission line, each of the plurality of data lines extends in the second direction, and each of the plurality of data lines is spaced apart from the signal transmission line.

7. The display panel as claimed in claim 6, wherein the display panel further comprises a plurality of second shielding lines opposite to the data lines in one-to-one correspondence, and the second shielding lines are disposed in a same layer as the first shielding line and separated from the first shielding line.

8. The display panel as claimed in claim 6, further comprising a driving circuit disposed on a side of the array substrate along a longitudinal direction of the data lines, wherein the driving circuit is connected to the data lines and the signal transmission line of the array substrate, and the driving circuit is configured to provide the data lines with data driving signals and configured to provide the signal transmission line with scan driving signals.

9. The display panel as claimed in claim 5, wherein the pixel electrode layer comprises a plurality of sub-pixel electrodes spaced apart from each other, each of the sub-pixel electrodes comprises a main electrode and a branch electrode connected to the main electrode, and the main electrode comprises a first part extending in the second direction; and wherein at least a part of the orthographic projection of the wiring part on the first substrate overlaps with an orthographic projection of the first part on the first substrate.

10. The array substrate as claimed in claim 4, wherein the wiring part comprises a plurality of split bodies corresponding to the sub-pixel electrodes in one-to-one correspondence, and the signal transmission line further comprises a connecting part configured to connect two adjacent ones of the split bodies.

11. The array substrate as claimed in claim 10, wherein at least a part of an orthographic projection of each of the split bodies on the first substrate overlaps with an orthographic projection of the first part on the first substrate.

12. The display panel as claimed in claim 9, wherein the wiring part comprises a plurality of split bodies corresponding to the sub-pixel electrodes in one-to-one correspondence, and the signal transmission line further comprises a connecting part configured to connect two adjacent ones of the split bodies.

13. The display panel as claimed in claim 12, wherein at least a part of an orthographic projection of each of the split bodies on the first substrate overlaps with an orthographic projection of the first part on the first substrate.

* * * * *